United States Patent
Jeong et al.

(10) Patent No.: US 9,423,468 B2
(45) Date of Patent: Aug. 23, 2016

(54) DIAGNOSTIC SYSTEM AND METHOD FOR FUEL CELL STACK

(71) Applicants: Hyundai Motor Company, Seoul (KR); Kangnam University Industry-Academia Cooperation Foundation, Yongin, Gyeonggi-Do (KR)

(72) Inventors: Kwi Seong Jeong, Yongin Gyeonggi-Do (KR); Sae Hoon Kim, Gyeonggi-Do (KR); Uck-Soo Kim, Gyeonggi-Do (KR); Hyun-Seok Park, Gyeonggi-Do (KR); Young-Hyun Lee, Gyeonggi-Do (KR)

(73) Assignees: Hyundai Motor Company, Seoul (KR); Kangnam University Industry-Academia Cooperation Foundation, Yongin, Gyeonggi-do (KR)

( * ) Notice: Subject to any disclaimer, the term of this patent is extended or adjusted under 35 U.S.C. 154(b) by 372 days.

(21) Appl. No.: 14/134,311

(22) Filed: Dec. 19, 2013

(65) Prior Publication Data
US 2014/0184264 A1 Jul. 3, 2014

(30) Foreign Application Priority Data
Dec. 27, 2012 (KR) .................. 10-2012-0155395

(51) Int. Cl.
*H01M 8/04* (2016.01)
*G01R 31/40* (2014.01)
*G01R 31/36* (2006.01)

(52) U.S. Cl.
CPC ............ *G01R 31/40* (2013.01); *H01M 8/0432* (2013.01); *H01M 8/04559* (2013.01); *H01M 8/04589* (2013.01); *H01M 8/04679* (2013.01); *G01R 31/3606* (2013.01); *Y02E 60/50* (2013.01)

(58) Field of Classification Search
None
See application file for complete search history.

(56) References Cited

U.S. PATENT DOCUMENTS

| 2004/0220752 | A1* | 11/2004 | Gopal | ............... | G01R 31/3658 |
| | | | | | 702/31 |
| 2009/0226770 | A1* | 9/2009 | Manabe | ........... | H01M 8/04567 |
| | | | | | 429/431 |

FOREIGN PATENT DOCUMENTS

| JP | 2007-173071 A | 7/2007 |
| JP | 2012-199010 A | 10/2012 |

\* cited by examiner

*Primary Examiner* — Jonathan Crepeau
(74) *Attorney, Agent, or Firm* — Mintz Levin Cohn Ferris Glovsky and Popeo, P.C.; Peter F. Corless

(57) ABSTRACT

A diagnostic system and method for a fuel cell stack that diagnoses the state and/or failure of the fuel cell stack. More specifically, the diagnostic control analyzer diagnoses and analyzes the state of the fuel cell stack by measuring the voltage and the current received from the fuel cell stack. To do this, an AC signal generator cogenerates a diagnostic AC signal according to the control upon receiving a control command form the analyzer, and an AC component driving element is then driven upon receiving the AC signal that is output from the AC signal generator in order to include a diagnostic AC component within the current of the fuel cell stack. In particular, the diagnostic control analyzer diagnoses the fuel cell stack based on a voltage and a current received from the fuel cell stack that includes the AC component via a load.

12 Claims, 4 Drawing Sheets

US 9,423,468 B2

DIAGNOSTIC SYSTEM AND METHOD FOR FUEL CELL STACK

CROSS-REFERENCE TO RELATED APPLICATION

This application claims priority to and the benefit of Korean Patent Application No. 10-2012-0155395 filed in the Korean Intellectual Property Office on Dec. 27, 2012, the entire contents of which are incorporated herein by reference.

BACKGROUND (a) Field of the Invention

The present invention relates to a diagnostic system of a fuel cell stack that diagnoses a state and/or a failure of the fuel cell stack.

(b) Description of the Related Art

A fuel cell is a device that converts the chemical energy from a fuel into electricity through a chemical reaction with oxygen or another oxidizing agent. Hydrogen is the most common fuel, but hydrocarbons such as natural gas and alcohols like methanol are sometimes used. Fuel cells are different from batteries in that they require a constant source of fuel and oxygen to run, but they can produce electricity continually for as long as these inputs are supplied Fuel cells may be applied to supply industrial, household, and vehicle driving power as well as to supply power to a small-sized electric/electronic product.

For example, one of the ways that a vehicle can be powered is by a fuel cell system such as a polymer electrolyte membrane fuel cell or a proton exchange membrane fuel cell (PEMFC). These types of fuel cells have a higher power density, fast starting time and fast power conversion reaction time at lower operational temperatures.

PEMFCs typically include a membrane electrode assembly (MEA) in which a catalyst electrode layer in which an electrochemical reaction occurs is attached to both sides of a solid polymer electrolyte film in which hydrogen ions move. Also included in the PEMFC, is a gas diffusion layer (GDL) that uniformly distributes reaction gases and transfers generated electrical energy through the cell. A gasket and an engaging device are also typically provided. The engaging device maintains an appropriate engaging pressure and airtightness of reaction gases and coolant. Also a bipolar plate is also provided to move reaction gases and coolant through the cell.

When assembling a fuel cell stack the gas diffusion layer and the MEA are disposed in the middle of the cell. As a result, the catalyst electrode layers of the MEA, i.e., an anode and a cathode to which a catalyst is applied so that hydrogen and oxygen may react at both surfaces of a polymer electrolyte film, are on the outer surfaces of the MEA. Then the gas diffusion layer and a gasket are stacked on top of the anode and the cathode respectively.

On the outer surface of the gas diffusion layer, a reaction gas (typically hydrogen as a fuel and oxygen or air as an oxidizing agent) is supplied, and a bipolar plate having a flow field through which coolant passes is placed thereon. By forming such a configuration in a unit cell, after a plurality of unit cells are stacked, an end plate for supporting a current collector, an insulation plate, and stacking cells are coupled on the outermost surfaces of the stack. By repeatedly stacking and engaging unit cells between the end plates, a fuel cell stack may be formed.

In order to obtain a potential necessary for a vehicle to be operated, unit cells should be stacked accordingly a necessary potential, in order to ensure that a sufficient potential is output by the cells.

The potential generated by each unit cell is typically about 1.3 V. Thus, in order to generate power that is necessary to power a vehicle, a significant number of cells must be stacked in series. Thus, determining during a failure which cell is not working appropriately can be time consuming and at times difficult. Thus, fuel cell vehicles require a diagnostic system to identify and determine individual unit failures.

FIG. 1 is a schematic diagram of a diagnostic system of a fuel cell stack according to an exemplary embodiment of the conventional art. Referring to FIG. 1, the diagnostic system of the fuel cell stack according to the exemplary embodiment of the conventional art includes an alternating current (AC) current injector 20 that injects a diagnostic AC current into a fuel cell stack 10, and a diagnostic analyzer 30 that performs diagnostics on the fuel cell stack 10 by analyzing the change in an AC current as result of the injection of the diagnostic AC current.

Because these types of diagnostic systems generally perform diagnosis through total harmonic distortion analysis (THDA) of a diagnostic AC current signal, the diagnostic analyzer 30 typically includes a harmonic analyzer.

When a diagnostic AC current $I_{AC}$ is injected into the fuel cell stack 10 by the AC current injector 20, the diagnostic AC current $I_{AC}$ is overlapped with a current $I_{STACK}$ of the fuel cell stack 10. Therefore, a diagnostic AC current $I_{AC}$ component is also included in a current $I_{LOAD}$ flowing to a load 40.

When the current $I_{STACK}$ of the fuel cell stack 10 and the diagnostic AC current $I_{AC}$ of the AC current injector 20 are overlapped and thus reach the load 40, the diagnostic analyzer 30 detects a voltage from the fuel cell stack 10, converts and analyzes a frequency of the detected voltage, and diagnoses a state and/or a failure of the fuel cell stack 10.

However, in order to prevent collision with a DC current from the fuel cell stack 10, the AC current injector 20 of a diagnostic system of an exemplary embodiment of the conventional art also generally includes a decoupling capacitor (CT). Because the CT of the AC current injector 20 should pass through a lower frequency of AC current, the CT should have a considerably large capacity. Therefore, the CT of the AC current injector 20 is formed by coupling multiple small capacity capacitors (CN) in parallel. However, due to the large quantity of these capacitors that is required, the overall size of the CT and the cost is greater than is desirable by most automotive manufactures. Additionally, when a diagnostic AC current of the AC current injector 20 passes through the CT, the diagnostic AC signal may be distorted and thus precise diagnostic may not be performed.

The above information disclosed in this Background section is only for enhancement of understanding of the background of the invention and therefore it may contain information that does not form the prior art that is already known in this country to a person of ordinary skill in the art.

SUMMARY

The present invention has been made in an effort to provide a diagnostic system of a fuel cell stack that is capable of economically diagnosing the fuel cell stack without distortion of an AC current while using a more simplified configuration by applying an AC diagnostic signal to a base of a power transistor so that a portion of the current from the fuel cell stack may flow through the power transistor in the form of a sine wave.

An exemplary embodiment of the present invention provides a diagnostic system of a fuel cell stack, including: a diagnostic control analyzer configured to diagnose and analyze a state of the fuel cell stack by measuring a voltage and a current of the fuel cell stack; an AC signal generator configured to generate a diagnostic AC signal according to a control signal from the diagnostic control analyzer; and an AC component driving element configured to be driven according to an AC signal that is output from the AC signal generator to include an diagnostic AC component in the current from the fuel cell stack. More specifically, the diagnostic control analyzer diagnoses the fuel cell stack based on a voltage and a current from the fuel cell stack including the AC component via a load. In particular, in some exemplary embodiments of the present invention, the AC component driving element may be a power transistor.

The diagnostic system of the fuel cell stack according to an exemplary embodiment of the present invention may further include an AC current injector configured to overlap an AC current with the current of the fuel cell stack. Additionally, a temperature sensor may be configured to detect a temperature of the power transistor so that the diagnostic control analyzer may select and operate one of the AC signal generator and the AC current injector based on ambient temperature that is detected by the temperature sensor.

In the above exemplary embodiment, the diagnostic control analyzer may be configured to operate the AC current injector when the ambient temperature is equal to or greater than a predetermined temperature, and operate the AC signal generator when the ambient temperature is less than the predetermined temperature.

As described above, according to an embodiment of the present invention, by applying the diagnostic AC signal to a base of AC component (e.g., a power transistor) so that a portion of the current from the fuel cell stack may flow through the AC component in a sinusoidal waveform, the fuel cell stack can economically be diagnosed without distortion of an AC current, and without the use of a CT, thereby allowing for a simpler configuration.

DETAILED DESCRIPTION

Figure 1:
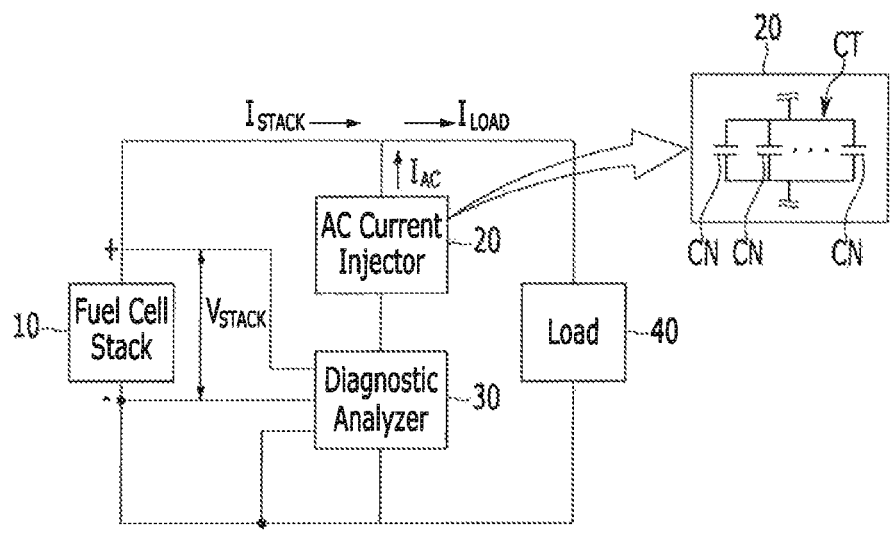
FIG. 1 is an exemplary schematic diagram of a diagnostic system for a fuel cell stack according to an exemplary embodiment of the related art.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Additionally, it is understood that the below methods are executed by at least one controller (e.g., the diagnostic analyzer). The term controller refers to a hardware device that includes a memory and a processor. The memory is configured to store the modules and the processor is specifically configured to execute said modules to perform one or more processes which are described further below.

Furthermore, the control logic of the present invention may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Furthermore, the terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Further, throughout the specification, like reference numerals refer to like elements.

A detailed description of the exemplary embodiments of the present invention will now be described in more detail.

Figure 2:
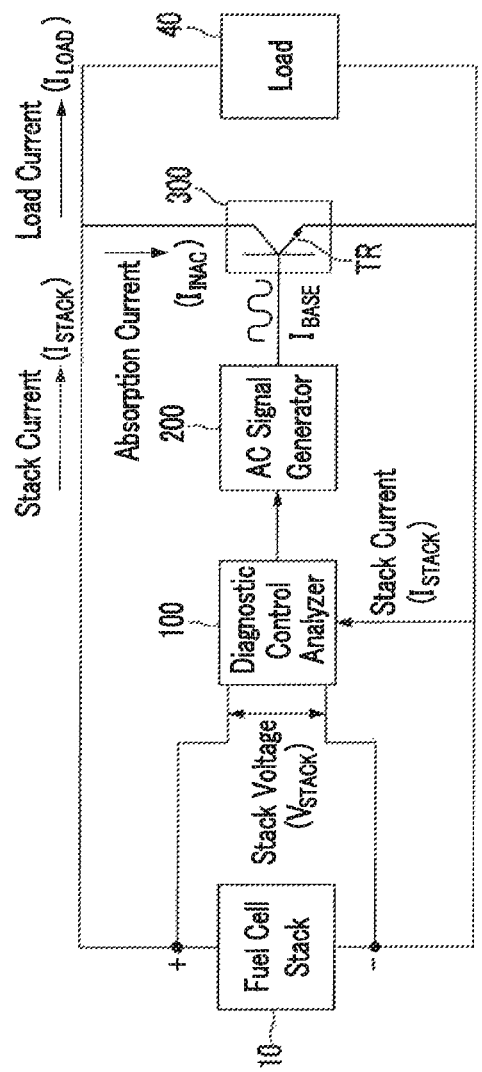
FIG. 2 is an exemplary schematic diagram of a diagnostic system for a fuel cell stack according to an exemplary embodiment of the present invention.

FIG. 2 is a schematic diagram of a diagnostic system of a fuel cell stack according to an exemplary embodiment of the present invention. A diagnostic system of a fuel cell stack according to an exemplary embodiment of the present invention is a system that diagnoses the fuel cell stack by applying an diagnostic AC signal to a base of a power transistor so that a portion of a current of the fuel cell stack may flow in a sine wave form through the power transistor.

The diagnostic system of a fuel cell stack according to an exemplary embodiment of the present invention includes: a diagnostic control analyzer 100 configured to diagnose and analyze a state of the fuel cell stack 10 by measuring a voltage $V_{STACK}$ and a current $I_{STACK}$ of the fuel cell stack 10 and frequency of the voltage $V_{STACK}$ and the current $I_{STACK}$; an AC signal generator 200 configured to generate a diagnostic AC signal $I_{BASE}$ based on a command (e.g., signal) from the diagnostic control analyzer 100; and an AC component driving element 300 configured to be driven according to an AC signal that is output from the AC signal generator 200 to include an diagnostic AC component in a current $I_{STACK}$ of the fuel cell stack 10.

In the exemplary embodiment of the present invention, diagnostic control analyzer 100 may correspond to a conventional diagnostic analyzer 30 (as shown in FIG. 1). The diagnostic control analyzer 100 diagnoses the fuel cell stack 10 based on a current and a voltage received from the fuel cell stack 10 that includes an AC component via a load 40.

In an exemplary embodiment of the present invention, the AC component driving element 300 may be, for example, formed as a power transistor (TR). However, it should be understood that the present invention is not limited to merely power transistors and other components may be utilized. Thus, other configurations capable of substantially corresponding to the TR may be used in the exemplary embodiment of the present invention.

Figure 3:
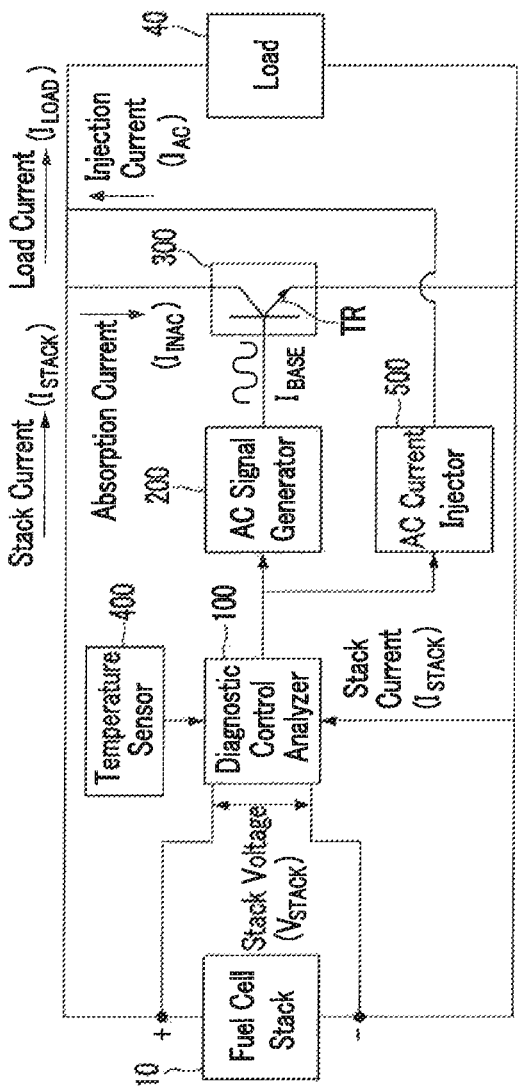
FIG. 3 is an exemplary schematic diagram of a diagnostic system for a fuel cell stack according to another exemplary embodiment of the present invention.

FIG. 3 is a schematic diagram of a diagnostic system of a fuel cell stack according to another exemplary embodiment of the present invention. In this exemplary embodiment, an AC current injector 500 is further included in the configuration shown in FIG. 3, which is not included in the configuration shown in FIG. 2. The AC current injector 500 may be the same as described in the description of the related art. As such, the AC current injector 500 overlaps the AC current $I_{AC}$ with the current $I_{STACK}$ of the fuel cell stack 10. Advantageously, by including both the AC current injector 500 and the TR, the AC current injector may be used in place of the TR when use of the TR would not be beneficial to overall system. In particular, because a considerable amount of heat is generated by the TR, the configuration illustrated in FIG. 2 may be appropriate in winter but may be inappropriate in summer. Thus, during this time period the AC current injector may be used. To do so, a temperature sensor 400 that can detect ambient temperature of the fuel cell stack 10 may be applied and based upon the detected temperature the system may be operated accordingly.

As such, in FIG. 3, the diagnostic control analyzer 100 may select and operate either the AC signal generator 200 or the AC current injector 500 based on the ambient temperature of the fuel cell stack 10 that is detected by the temperature sensor 400. For example, the diagnostic control analyzer 100 may operate the AC current injector 500 when the ambient temperature is equal to or greater than a predetermined temperature (e.g., 30° C.) and operate the AC signal generator 200 when the ambient temperature is less than the predetermined temperature. The diagnostic control analyzer 100, the AC signal generator 200, and the AC current injector 500 may be formed with at least one microprocessor or processor which is configured to operate via a predetermined program or hardware the control operations of the present invention. Further, the diagnostic control analyzer 100, the AC signal generator 200, and the AC current injector 500 may be formed as an integrated body in order to further reduce the size of the overall device.

Figure 4:
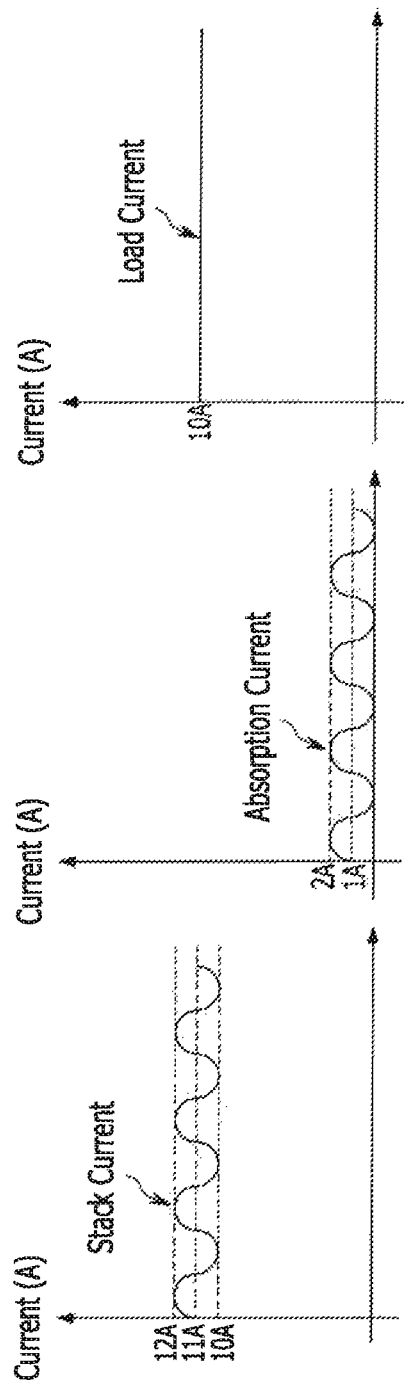
FIG. 4 is an exemplary graph illustrating operation for a diagnostic system of a fuel cell stack according to an exemplary embodiment of the present invention.

Hereinafter, operation of a diagnostic system of a fuel cell stack according to an exemplary embodiment of the present invention will be described in detail with reference to FIGS. 2 to 4.

When diagnostic of the fuel cell stack 10 is started, the diagnostic control analyzer 100 determines whether an ambient temperature of the fuel cell stack 10 is equal to or greater than the predetermined temperature based on a signal from temperature sensor 400. When the ambient temperature of the fuel cell stack 10 is less than the predetermined temperature, the AC signal generator 200 generates an AC signal $I_{BASE}$ so that an absorption current $I_{INAC}$ may flow to the TR, and applies the AC signal $I_{BASE}$ to a base of the TR according to the control commands or signals from the diagnostic control analyzer 100, as shown in FIG. 4.

Considerably low power may be applied to the base of the TR. In particular, the AC signal $I_{BASE}$ applied to the base of the TR is a current of an amplifying area, and is controlled to flow to a base current by an amplifying ratio. When the ambient temperature of the fuel cell stack 10 is less than the predetermined temperature, the diagnostic control analyzer 100 may stop operation of the AC current injector 500. When the AC signal generator 200 applies the AC signal $I_{BASE}$ to the TR, because the absorption current $I_{INAC}$ flows to the TR, the AC component is included in the current $I_{STACK}$ of the fuel cell stack 10, as illustrated in FIG. 4. When the AC component is included in the current $I_{STACK}$ of the fuel cell stack 10, an AC component is included in a load current $I_{LOAD}$ flowing to the load 40.

As described above, as the absorption current $I_{INAC}$ is generated via driving of the TR, when the AC component (e.g., AC current) is included in the current $I_{STACK}$ of the fuel cell stack 10, the diagnostic control analyzer 100 analyzes a frequency of the current and/or a voltage of the fuel cell stack 10 in which the AC component is included through a general diagnostic method and diagnoses a failure and/or a state of the fuel cell stack 10.

A method of diagnosing a fuel cell stack through a current and/or a voltage of a fuel cell stack in which the AC component (e.g., an AC current) is included may follow a general method or a method of the conventional art. Further, when the ambient temperature of the fuel cell stack 10 is equal to or greater than the predetermined temperature, the AC current injector 500 generates a diagnostic AC current, and overlaps the generated diagnostic AC current with the current $I_{STACK}$ of the fuel cell stack 10 according to the control of the diagnostic control analyzer 100. Then, the diagnostic of the fuel cell stack 10 is performed through processes as described in the conventional art or as described above.

When the ambient temperature of the fuel cell stack 10 is equal to or greater than the predetermined temperature, the diagnostic control analyzer 100 may stop operation of the AC signal generator 200. Therefore, according to an exemplary embodiment of the present invention, by applying an AC signal for diagnostic to a base of a power transistor so that a portion of a current of a fuel cell stack can flow in a sine wave form through the power transistor, a fuel cell stack can be economically diagnosed without distortion of an AC current, with a simple configuration.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of Reference Numbers>

| | |
|---|---|
| 10: Fuel cell stack | 100: Diagnostic control analyzer |
| 200: AC signal generator | 300: AC component driving element |
| 400: Temperature sensor | 500: AC current injector |

TR: Power transistor

What is claimed is:

1. A diagnostic system of a fuel cell stack, comprising:
a diagnostic control analyzer configured to diagnose and analyze a state of the fuel cell stack by measuring a voltage and a current of the fuel cell stack;
an AC signal generator configured to generate a diagnostic AC signal upon receiving a control command from the diagnostic control analyzer;
an AC component driving element configured to be driven according to the diagnostic AC signal that is output from the AC signal generator to include a diagnostic AC component within the current from the fuel cell stack; and
an AC current injector configured to selectively overlap an AC current with the current of the fuel cell stack based upon receiving a control command from the diagnostic control analyzer.

2. The diagnostic system of claim 1, wherein the AC component driving element is a power transistor.

3. The diagnostic system of claim 1, further comprising a temperature sensor configured to detect a temperature of the power transistor,
wherein the diagnostic control analyzer selects between and operates accordingly either the AC signal generator or the AC current injector based on ambient temperature that is detected by the temperature sensor.

4. The diagnostic system of claim 3, wherein the diagnostic control analyzer operates the AC current injector when the ambient temperature is equal to or greater than a predetermined temperature, and operates the AC signal generator when the ambient temperature is less than the predetermined temperature.

5. A diagnostic method for a fuel cell stack, comprising:
diagnosing and analyzing, by a processor, a state of the fuel cell stack by measuring a voltage and a current of the fuel cell stack;
generating, by an AC signal generator, a diagnostic AC signal upon receiving a control signal from the diagnostic control analyzer;
driving an AC component driving element upon receiving the diagnostic AC signal that is output from the AC signal generator to include a diagnostic AC component within the current from the fuel cell stack; and
selectively operating an AC current injector to overlap an AC current with the current of the fuel cell stack upon receiving a control command from the diagnostic control analyzer.

6. The diagnostic method of claim 5, wherein the AC component driving element is a power transistor.

7. The diagnostic system of claim 5, further comprising a temperature sensor configured to detect a temperature of the power transistor,
wherein the diagnostic control analyzer selects between and operates accordingly either the AC signal generator or the AC current injector based on ambient temperature that is detected by the temperature sensor.

8. The diagnostic method of claim 7, further comprising: operating the AC current injector when the ambient temperature is equal to or greater than a predetermined temperature, and operating the AC signal generator instead of the AC current injector when the ambient temperature is less than the predetermined temperature.

9. A non-transitory computer readable medium containing program instructions executed by a processor, the computer readable medium comprising:
program instructions that diagnose and analyze a state of the fuel cell stack by measuring a voltage and a current of the fuel cell stack;
program instructions that generate a diagnostic AC signal upon receiving a control command;
program instructions that drive an AC component driving element by generating the diagnostic AC signal that is output from the AC signal generator to include an AC component for diagnosis in the current from the fuel cell stack; and
program instructions that select between and operate accordingly either an AC signal generator or an AC current injector based on ambient temperature that is detected by a temperature sensor.

10. The non-transitory computer readable medium of claim 9, wherein the AC component driving element is a power transistor.

11. The non-transitory computer readable medium of claim 10, further comprising program instructions that selectively overlap an AC current with the current from the fuel cell stack by issuing a control command.

12. The non-transitory computer readable medium of claim 9, further comprising program instructions that operate the AC current injector when the ambient temperature is equal to or greater than a predetermined temperature, and operate the AC signal generator when the ambient temperature is less than the predetermined temperature.

* * * * *